(12) United States Patent
Uchida et al.

(10) Patent No.: US 7,081,639 B2
(45) Date of Patent: Jul. 25, 2006

(54) SEMICONDUCTOR PHOTODETECTION DEVICE AND FABRICATION PROCESS THEREOF

(75) Inventors: Toru Uchida, Nakakoma (JP); Chikashi Anayama, Nakakoma (JP)

(73) Assignee: Fujitsu Quantum Devices Limited, Yamanashi (JP)

(*) Notice: Subject to any disclaimer, the term of this patent is extended or adjusted under 35 U.S.C. 154(b) by 0 days.

(21) Appl. No.: 09/873,264

(22) Filed: Jun. 5, 2001

(65) Prior Publication Data
US 2001/0048118 A1    Dec. 6, 2001

(30) Foreign Application Priority Data

| Jun. 6, 2000 | (JP) | ............................ 2000-169448 |
| Sep. 29, 2000 | (JP) | ............................ 2000-301489 |

(51) Int. Cl.
*H01L 31/0304* (2006.01)
(52) U.S. Cl. ............................. 257/21; 257/18
(58) Field of Classification Search ............... 257/17, 257/18, 21, 184, 186, 188, 189–191
See application file for complete search history.

(56) References Cited

U.S. PATENT DOCUMENTS

| 4,607,272 A | 8/1986 | Osbourn ..................... 357/30 |
| 4,952,792 A | 8/1990 | Caridi ...................... 250/211 J |
| 5,308,995 A * | 5/1994 | Tsuji et al. ................... 257/17 |
| 5,313,073 A * | 5/1994 | Kuroda et al. ................ 257/18 |
| 5,412,225 A * | 5/1995 | Dutta et al. .................. 257/18 |
| 5,471,068 A * | 11/1995 | Tsuji et al. ................... 257/21 |
| 5,572,043 A | 11/1996 | Shimizu et al. ............... 257/18 |
| 5,698,863 A * | 12/1997 | Pelekanos ..................... 259/71 |
| 5,929,462 A * | 7/1999 | Kasukawa et al. ............ 257/18 |
| 6,100,543 A * | 8/2000 | Sakata ........................ 257/21 |
| 6,222,200 B1 * | 4/2001 | Svilans ........................ 257/18 |
| 6,229,152 B1 * | 5/2001 | Dries et al. ................... 257/17 |

FOREIGN PATENT DOCUMENTS

| JP | 60-95981 | 5/1985 |
| JP | 62-35682 | 2/1987 |
| JP | 2-90575 | * 3/1990 |
| JP | 03-139886 | 6/1991 |
| JP | 04-042983 | 2/1992 |
| JP | 04-212129 | 8/1992 |
| JP | 04-229823 | 8/1992 |
| JP | 0 627 771 A1 | 12/1993 |
| JP | 06-140624 | 5/1994 |
| JP | 06-188449 | 7/1994 |
| JP | 06-296037 | 10/1994 |
| JP | 7-74381 | 3/1995 |

OTHER PUBLICATIONS

Ng, "Complete Guide to Semiconductor Devices," 1995, McGraw Hill, Inc. pp. 402-405.*

(Continued)

*Primary Examiner*—Jerome Jackson
(74) *Attorney, Agent, or Firm*—Westerman, Hattori, Daniels & Adrian, LLP.

(57) ABSTRACT

A semiconductor photodetection device includes a photodetection layer formed of an alternate and repetitive stacking of an optical absorption layer accumulating therein a compressive strain and a stress-compensating layer accumulating therein a compensating tensile strain, wherein the optical absorption layer has a thickness larger than a thickness of the stress-compensating layer.

15 Claims, 9 Drawing Sheets

OTHER PUBLICATIONS

English translation of JP 7-074,381.*
Office Action dated Apr. 13, 2004 from Japanese Patent Office for JP2000-301489.

"High-speed photodetectors on InGaAs/GaAs-on-GaAs superlattices" M. Zirngibl and M. Ilegems; J. Appl. Phys. 69 (12), Jun. 15, 1991.

* cited by examiner

SEMICONDUCTOR PHOTODETECTION DEVICE AND FABRICATION PROCESS THEREOF

CROSS-REFERENCE TO RELATED APPLICATION

The present application is based on Japanese priority applications No.2000-301489 filed on Sep. 29, 2000 and No.2000-169448 filed on Jun. 6, 2000, the entire contents of which are hereby incorporated by reference.

BACKGROUND OF THE INVENTION

The present invention generally relates to optical semiconductor devices and more particularly to a semiconductor photodetection device and fabrication process thereof.

With widespread use of internet, there is emerging tightness of capacity in optical telecommunication network. In order to deal with the problem, the technology of so-called wavelength-division multiplexing (WDM) is now becoming in use. In WDM, plural optical carriers of different wavelengths are transmitted via a single optical fiber, wherein the optical carriers are modulated with respective modulation signals.

In order to increase the bandwidth of the WDM channels, a study is being made to expand the wavelength range of the optical carriers to longer wavelength side, up to the wavelength of 1620 nm (so-called L-band). In order to implement this technology, it is necessary to provide a semiconductor photodetection device having sufficient sensitivity in the long wavelength range of 1620 nm.

FIG. 1 shows the construction of a conventional PIN photodiode 20 of the type that receives incoming optical signal at a rear surface.

Referring to FIG. 1, the PIN photodiode 20 is constructed on a substrate 7 of n-type InP, and includes a first buffer layer 6 of n-type InP formed on the substrate 7, a second buffer layer 4 of n-type InP formed on said buffer layer 6, a photodetection layer 3 of n-type InGaAs formed on the n-type InP buffer layer 4, a cladding layer 2 of n-type InP formed on the photodetection layer 3, and a contact layer 1 of undoped InGaAsP formed on the cladding layer 2, wherein the foregoing second buffer layer 4, the photodetection layer 3, the cladding layer 2 and the contact layer 1 form a mesa structure on the first buffer layer 6. In order to facilitate the formation of the mesa structure, there is provided an etching stopper layer 5 of n-type InGaAsP between the first buffer layer 6 and the second buffer layer 4.

The contact layer 1 and the cladding layer 2 are further formed with a p-type diffusion region 8, and a p-type electrode 9 is provided in contact with the foregoing p-type diffusion region 8. Further, an n-type electrode 10 is provided on the n-type InGaAsP etching stopper layer 5 in the part exposed as a result of the mesa formation. Further, a micro-lens 7A is formed on the bottom surface of the InP substrate 7.

In the PIN photodiode 20, the incident optical beam incident to the bottom surface of the InP substrate 7 is focused into the part located in the vicinity of the photodetection layer 3 and there occurs excitation of photocarriers in the part located in the vicinity of the photodetection layer 3. The photocarriers thus excited are then caused to flow to the p-type electrode 9 or to the n-type electrode 10 depending on the polarity and form a photocurrent.

In such a PIN photodiode 20, it is generally practiced to form the InGaAs photodetection layer 3 with a thickness of about 2 µm and with a composition chosen so as to achieve lattice matching with respect to the InP substrate 7, for minimizing the occurrence of crystal defects and for maximizing the efficiency of optical absorption. As long as the photodetection layer 3 has a thickness of about 2 µm, a satisfactory optical absorption efficiency is achieved while simultaneously suppressing the problem of carrier transit time, and a high-speed response sufficient for dealing with a transmission rate of 10 Gbit/s as used in optical fiber telecommunication network is attained.

In the PIN photodiode 20 of FIG. 1, it should be noted that the InGaAs photodetection layer shows a bandgap wavelength of about 1650 nm at room temperature in view of the necessity of achieving lattice matching with the InP substrate 7. Thus, the PIN photodiode 20 can detect the optical signal of longer wavelength of 1620 nm as long as the PIN photodiode 20 is operated in a room temperature environment. On the other hand, the photodiode 20 used in an optical fiber telecommunication network is required to guarantee a proper operation even in extremely low temperature environment as low as −40° C.

When the PIN photodiode 20 of FIG. 1 is operated in such a low temperature environment, on the other hand, there occurs an increase in the bandgap of the photodetection layer 3, and thus, the efficiency of optical absorption of the layer 3 drops below 50%. While such an increase of the bandgap can be compensated for by increasing the In content in the layer 3, such an increase of the In content in turn invites a lattice misfit between the photodetection layer 3 and the InP substrate 7. Thus, when the photodetection layer 3 is to be formed with the thickness of 2 µm suitable for optical absorption, it is inevitable that there occurs a substantial defect formation in the photodetection layer 3. When there occurs an increase of defects in the photodetection layer 3, there arises various problems including increase of leakage current and increase of dark current. In order to avoid the formation of crystal defects, it is necessary to suppress the strain accumulated in the photodetection layer 3 to be less than 0.1%. However, this requirement is contradictory to the requirement to compensate for the unwanted increase of the bandgap at low temperature environment.

In order to deal with this problem, there has been a proposal, in Japanese Laid-Open Patent Publication 7-74381 or 62-35682, to construct the photodetection layer 3 from an optical absorption layer and a strain-compensating layer disposed adjacent to the optical absorption layer and cause the strain-compensating layer to accumulate a counteracting strain (tensile strain in the present case) therein such that the strain-compensating layer and the optical absorption layer as a whole compensate for the stress caused in the photodetection layer 3 by the substrate 7. According to such a construction, it is possible to secure a sufficient thickness for the optical absorption layer by repeatedly stacking the optical absorption layer and the strain-compensating layer alternately.

For example, the Japanese Laid-Open Patent Publication 7-74381 discloses a photodetection layer 21 represented in FIG. 2 in which the photodetection layer 21 is formed of an alternate repetition of an optical absorption layer 21a having a composition of $In_{0.53-x}Ga_{0.47+x}As$ and accumulating therein a tensile strain and a strain-compensating layer 21b having a composition of $In_{0.53+x}Ga_{0.47-x}As$ and accumulating therein a compressive strain.

In the example of FIG. 2, the photodetection layer 21 is interposed between a lower contact layer 22 of n-type InP and an upper contact layer 23 of p-type InP. Further, the Japanese Laid-Open Patent Publication 62-35682 discloses a photodetection layer provided on a GaAs substrate and formed of an alternate repetition of a GaAs layer having a thickness of 10 nm and an AlGaAs layer having a thickness of 10 nm.

These conventional structures, however, have suffered from the problem in that the net thickness of the optical absorption layer in the photodetection layer becomes only one-half the total thickness of the photodetection layer.

Thus, it has been necessary to increase the number of repetitions in such a structure in order to secure a necessary total thickness for the optical absorption layer, while such an increase of the number of repetitions invites increase of the total thickness of the photodetection layer.

When the total thickness of the photodetection layer is thus increased excessively, the transit time of the carriers increases also, and the advantageous high-speed response of the conventional PIN photodiode may be lost as a result of the use of such a strained superlattice structure for the photodetection layer.

SUMMARY OF THE INVENTION

Accordingly, it is a general object of the present invention to provide a novel and useful optical semiconductor device wherein the foregoing problems are eliminated.

Another and more specific object of the present invention is to provide a high-speed semiconductor photodetection device for use in optical fiber transmission system and is operable in a longer optical wavelength band.

Another object of the present invention is to provide a semiconductor photodetection device, comprising:

a semiconductor substrate of a first conductivity type;

a photodetection layer formed on said semiconductor substrate;

a region of a second conductivity type opposite to said first conductivity type being formed in a part of said photodetection layer; and an electrode applying an electric field to said photodetection layer via said region of said second conductivity type such that said electric field acts in a thickness direction of said photodetection layer, said photodetection layer comprising: a first semiconductor layer having a first thickness and accumulating therein a compressive strain and absorbing an optical radiation; and a second semiconductor layer having a second thickness smaller than said first thickness and accumulating therein a tensile strain, said first semiconductor layer and said second semiconductor layer being stacked alternately and repeatedly in said photodetection layer.

It is preferable to form the first semiconductor layer such that the first semiconductor layer accumulates therein a strain of 0.2% or more but not exceeding 0.6%. Further, it is preferable to form the first semiconductor layer to have a thickness of 50 nm or more. The second semiconductor layer is preferably formed to have a thickness smaller than a sum of the thickness of the first semiconductor layer and the thickness of the second semiconductor layer by a factor given by $(0.9 \times L^{1/4} \times \epsilon)$ wherein L represents a sum of the total thickness, represented in terms of microns, of the first and second semiconductor layers in the photodetection layer, and $\epsilon$ represents the strain accumulated in the first semiconductor layer represented in terms of percent. It is preferable to set the thickness of the second semiconductor layer to be smaller than the thickness of the first semiconductor layer by a factor of ½. Further, it is preferable to form the first and second semiconductor layers by a ternary compound semiconductor material. For example, the substrate may be an n-type InP substrate and the first and second semiconductor layers may be formed of InGaAs. Further, it is preferable to provide an intermediate layer between the first and second semiconductor layers with a composition chosen so as to provide a bandgap intermediate to the bandgaps of the first and second semiconductor layers. Thereby, it is preferable to form the intermediate layer along the interface between the first and second semiconductor layers at the side of the region of the second conductivity type. Further, the composition of the intermediate layer may be changed gradually. In the latter case, it is preferable to change the composition of the intermediate layer such that the intermediate layer accumulates a tensile strain at the interface to the second semiconductor layer and a compressive strain at the interface to the first semiconductor layer.

Another object of the present invention is to provide a fabrication process of a semiconductor photodetection device, comprising the steps of:

forming a photodetection layer on a semiconductor substrate by alternately and repeatedly forming a first semiconductor layer and a second semiconductor layer on said semiconductor substrate while changing a flow-rate of source gases without interrupting a supply thereof; and forming an electrode on said photodetection layer so as to apply an electric field in a thickness direction of said photodetection layer, said first semiconductor layer being formed of a ternary compound semiconductor material having a lattice constant different from a lattice constant of said substrate and accumulating therein a compressive strain, said second semiconductor layer being formed of a ternary compound semiconductor material having a lattice constant different from said lattice constant of said substrate and accumulating therein a tensile strain.

Preferably, the first and second semiconductor layers are formed by an MOVPE process. Thereby, the first and second semiconductor layers are formed alternately and repeatedly by changing the flow-rate of metal organic source materials continuously, without interruption.

According to the present invention, it becomes possible to increase the net thickness of the optical absorption layer in the photodetection layer having a superlattice structure by accumulating a compressive strain in the first semiconductor layer acting as an optical absorption layer and a tensile strain in the second semiconductor layer acting as a strain-compensating layer, while simultaneously reducing the total thickness of the photodetection layer. As a result, it becomes possible to realize a high-speed semiconductor photodetection device having optical sensitivity in the long wavelength range.

Other objects and further features of the present invention will become apparent from the following detailed description when read in conjunction with the attached drawings.

DETAILED DESCRIPTION OF THE INVENTION

[Principle]

In the case the thickness of a strain-compensating layer is reduced in a superlattice structure in which an optical absorption layer having a compressive strain and a strain-compensating layer having a tensile strain are repeated alternately, it is necessary to increase the tensile strain in the strain-compensating layer for effective compensation of the compressive strain in the optical absorption layer, while such an increase of the strain in the strain-compensating layer may raise the problem that a "strain threshold" may be exceeded and crystal defects may develop extensively at the interface between the optical absorption layer and the strain-compensating layer.

The inventor of the present invention conducted experimental investigations with regard to the strain threshold and obtained a relationship to be described in detail in the present specification. It should be noted that the foregoing "strain threshold" is pertinent to the strain compensation structure in which a tensile strain layer and a compressive strain layer are stacked alternately and repeatedly and is not related at all to the well-known concept of critical thickness based on the mechanism of misfit dislocations.

Figure 3:
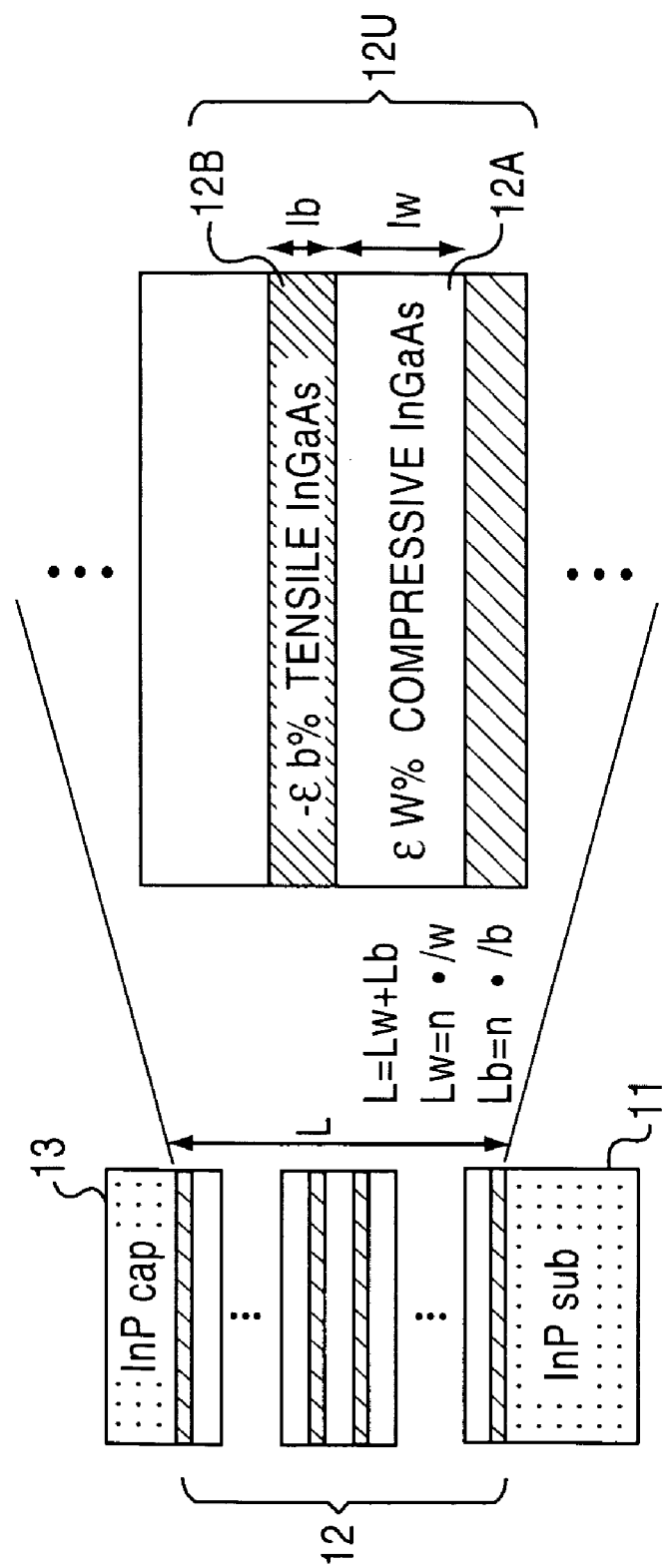
FIG. 3 is a diagram showing the principle of the present invention.

First, explanation will be made with regard to the experiments conducted by the inventor while referring to FIG. 3 showing a model structure used in the experiment.

Referring to FIG. 3, the model structure is formed of an InP substrate 11 and a superlattice structure 12 formed on the substrate 11, wherein the superlattice structure 12 includes an alternate repetition of an InGaAs optical absorption layer 12A and a strain-compensating layer 12B with respective compositions chosen such that the InGaAs optical absorption layer 12A accumulates therein a compressive strain in the state in which the layer 12A is formed epitaxially on the InP substrate 11 and such that the InGaAs strain-compensating layer 12B accumulates therein a tensile strain in the state the layer 12B is formed on the InP substrate 11 epitaxially.

Representing the compressive strain in the optical absorption layer 12A as +$\epsilon w$ % and the tensile strain in the strain-compensating layer 12B as −$\epsilon b$ %, the thickness lw of the optical absorption layer 12A and the thickness lb of the strain-compensating layer 12B are set so as to satisfy the relationship $$\epsilon w \cdot Lw = \epsilon b \cdot Lb \quad (1)$$

wherein Lw represents the total thickness of the optical absorption layers 12A in the superlattice structure and is given as Lw=n·lw, while Lb represents the total thickness of the strain-compensating layers 12B in the superlattice structure and is given as Lb=n·lb, n being the number of repetitions in the superlattice structure.

Further, an InP cap layer 13 is formed on the superlattice structure 12 epitaxially as represented in FIG. 3.

Figure 4:
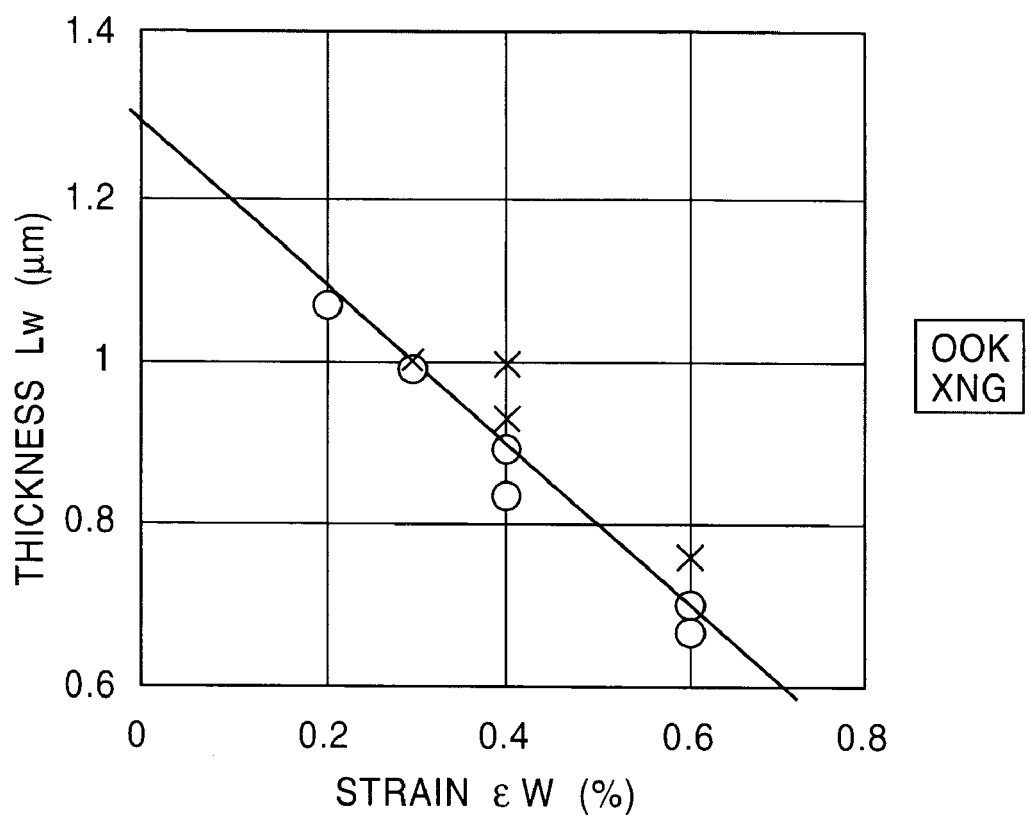
FIG. 4 is another diagram showing the principle of the present invention.

FIG. 4 represents the quality of surface morphology obtained for the cap layer 13 when the total thickness Lw of the optical absorption layer 12A and the strain $\epsilon w$ therein are changed variously under the constraint that the total thickness L of the superlattice structure 12, and hence the sum of the total thicknesses of the optical absorption layers 12A and the strain-compensating layers 12B, is set to 1.3 µm. From the relationship of Eq. (1), the strain $\epsilon b$ in the strain-compensating layer 12B is given as $\epsilon b = \epsilon w \cdot Lw/Lb$. In FIG. 4, the case in which a flat surface morphology is obtained for the cap layer 13 is represented by ○, while the case in which an irregular surface morphology is obtained is represented by ×.

Referring to FIG. 4, it can be seen that an irregular surface morphology appears on the surface of the cap layer 13 in the event both the strain $\epsilon w$ and the total thickness Lw are large. Further, it can be seen that a flat, excellent surface morphology is obtained in the event both the strain $\epsilon w$ and the total thickness Lw are small. FIG. 4 further indicates that the region where excellent surface morphology is obtained (designated in FIG. 4 by ○) and the region where poor surface morphology is obtained (designated in FIG. 4 by ×) are divided from each other by a thick straight line given by an equation $$Lw = A \times \epsilon w + L. \quad (2)$$

It is believed that the surface morphology observed on the surface of the cap layer 12 reflects the surface morphology of the optical absorption layer 12A and the strain-compensating layer 12B in the superlattice structure 12 underneath the cap layer 13. Thus, in the region represented in FIG.4 by ×, it is believed that the regular stacking of the optical absorption layer 12A and the strain-compensating layer 12B is destroyed. Therefore, it is necessary, in view of the result of FIG.4, to chose the thickness Lw of the optical absorption layers 12A and the strain $\epsilon w$ so as to fall in the region of excellent surface morphology defined by Eq.(2) when the superlattice structure 12 of FIG.3 is to be used for the photodetection layer of a semiconductor photodetection device.

Figure 5:
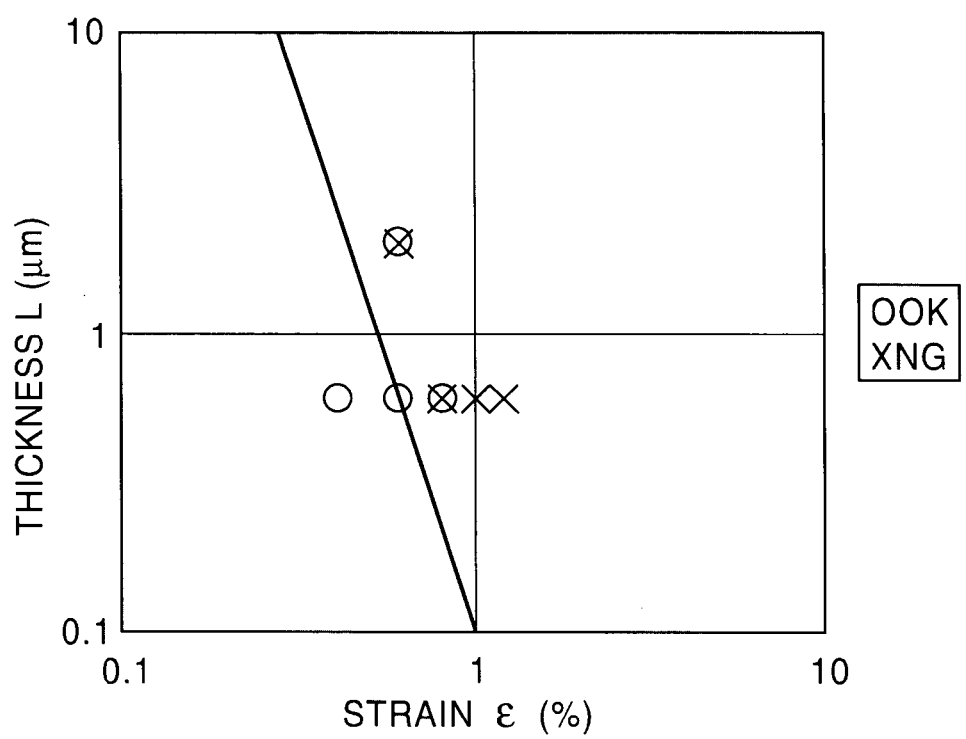
FIG. 5 is a further diagram showing the principle of the present invention.

FIG. 5 shows the morphology of the model structure of FIG. 3 for the case in which the total thickness Lw of the optical absorption layers 12A is set identical with the total thickness Lb of the strain-compensating layer 12B and in which the strain $\epsilon w$ is set identical with the strain $\epsilon b$. Thus, there hold relationships $$Lw = Lb = L/2, \text{ and} \quad (3)$$

$$\epsilon w = \epsilon b = \epsilon. \quad (4)$$

When the thickness L and the strain $\epsilon$ are changed variously, it can be seen from FIG. 5 that an irregular surface morphology appears on the surface of the cap layer 13 when both the strain $\epsilon$ and the thickness L are set large as can be seen by the result represented by ×. When the strain $\epsilon$ and the thickness L are both set small, on the other hand, it can be seen that an excellent flat surface morphology is obtained as can be seen by the result represented by ○. In FIG. 5, the region where excellent surface morphology is obtained (represented by ○) and the region where only poor surface morphology is obtained (represented by ×) are defined by a thick line represented by an equation $$L = 0.1/\epsilon^4. \quad (5)$$

In FIG. 5, the apparent overlapping of ○ and × is merely caused as a result of superposition of data for different number of the layers included in the superlattice structure 12.

Eq.(2) noted above should satisfy Eqs.(3) and (4), and thus, an equation $$Lw=-L^{5/4}\cdot\epsilon w/(2\times 0.1^{1/4})+L \quad (6)$$

is obtained by solving Eq.(2) with respect to the coefficient A and representing the same by using L.

As long as the relationship of Eq.(6) is satisfied, the strain in the superlattice structure is within a "strain threshold" or allowable range of strain in which the deterioration of surface morphology explained with reference to FIGS. 4 and 5 is successfully avoided.

Using Eq.(6), the ratio of Lb to L is represented as $$Lb/L=(L-Lw)/L=L^{1/4}\cdot\epsilon w/(2\times 0.1^{1/4})=0.89\cdot L^{1/4}\epsilon w. \quad (7)$$

Eq.(7) thus obtained indicates that it is possible to reduce the total thickness Lb of the strain-compensating layer 12B with respect to the total thickness L of the superlattice structure by a factor of about $(0.9\cdot L^{1/4}\cdot\epsilon w)$, without exceeding the foregoing strain threshold.

In the case of using the strained superlattice structure 12 for the photodetection layer of a semiconductor photodetection device, it is preferable to increase the total thickness Lw of the optical absorption layers 12A for increasing the efficiency of optical absorption. On the other hand, from the relationship of FIG. 4 noted before, it is necessary to increase the thickness lb of the strain-compensating layer 12B, and hence the total thickness Lb, with the increase of the strain $\epsilon w$ in the optical absorption layer 12A. In view of the limitation imposed on the total thickness Lb of the strain-compensating layers 12B from Eq.(7), a limitation is imposed also on the total thickness Lw of the optical absorption layers 12A.

Figure 6:
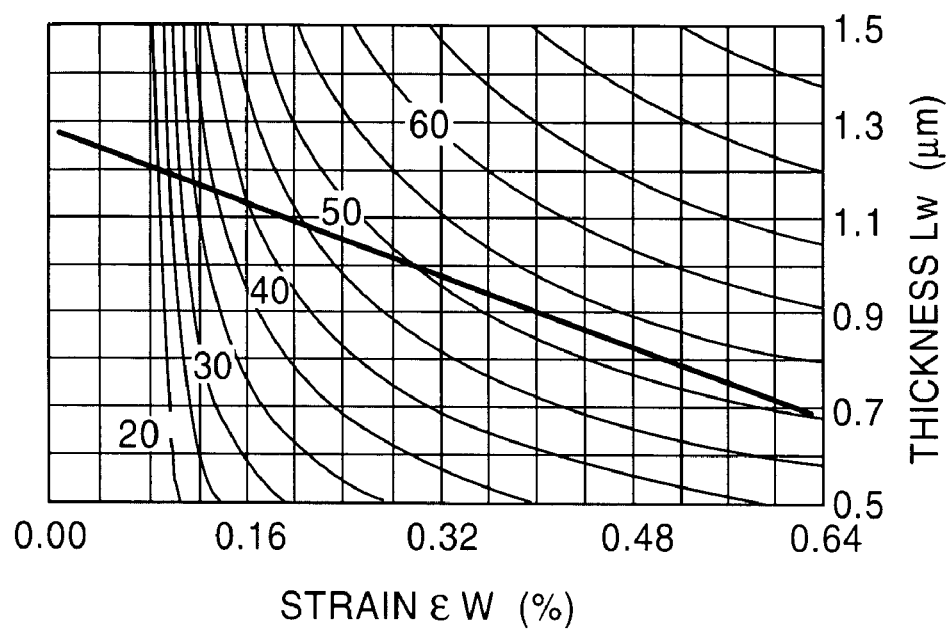
FIG. 6 is a further diagram showing the principle of the present invention.

FIG. 6 shows the relationship of FIG. 4 together with the efficiency of optical absorption η, wherein the contours in FIG. 6 represent the efficiency η. It should be noted that the efficiency η of FIG. 6 is calculated from the total thickness Lw of the optical absorption layer 12A and the strain $\epsilon w$ for the case in which an incident optical beam having a wavelength of 1.62 μm comes in perpendicularly to the InGaAs superlattice structure 12 at the temperature of −40° C.

From FIG. 6, it can be seen that an efficiency η exceeding 50% can be achieved when the strain $\epsilon w$ in the optical absorption layers 12A is in the range of 0.25% or more but not exceeding 0.6%.

Meanwhile, such a strained superlattice structure including highly strained strain-compensating layers in addition to oppositely strained optical absorption layers tend to raise the problem in that there occurs an increase of difference in the bandgap between the optical absorption layer 12A and the strain-compensating layer 12B and the absorption wavelength of the optical absorption layer may experience a shift in the shorter wavelength direction as a result of quantum shift. In order to avoid this problem of wavelength shift in unwanted direction, the present invention sets the thickness of the optical absorption layer to 50 nm or more such that no quantum shift occurs. Alternatively, the quantum shift may be controlled such that the absorption wavelength of the optical absorption layer covers the wavelength band of 1620 nm at −40° C.

According to the present invention as set forth above, it becomes possible to conduct the desired optical detection at the wavelength of 1620 nm stably over a wide temperature range. Further, it becomes possible to increase the total thickness of the optical absorption layers in the photodetection layer to the value of about 1 μm or more.

Further, the present invention proposes the use of an intermediate layer between the optical absorption layer and the strain-compensating layer with an intermediate bandgap, such that accumulation of carriers taking place in the vicinity of the interface between the optical absorption layer and the strain-compensating layer as a result of the difference of bandgap of these two layers, is effectively resolved. Thus, by providing such an intermediate layer, the problem of decrease of the optical current, particularly the hole current, caused by the accumulation of the carriers at the foregoing interface is successfully avoided. Further, the problem of formation of capacitance caused as a result of the carrier accumulation is also eliminated by providing the intermediate layer. Thereby, the response speed of the semiconductor photodetection device is improved.

The intermediate layer is preferably formed adjacent to the optical absorption layer at the p-type side (far side from the substrate) where the accumulation of the holes is most likely to occur. Thereby, the intermediate layer may be formed to have a compositional gradation such that the bandgap changes gradually in the thickness direction. By providing a compositional gradation such that there occurs an accumulation of tensile strain at the interface to the strain-compensating layer and such that there occurs an accumulation of compressive strain at the interface to the optical absorption layer, the problem of the hole current having a smaller mobility tends to be blocked at such an interface is effectively reduced.

Further, the present invention forms the optical absorption layer and the stress-compensating layer by an MOVPE process continuously without interruption. Thus, the problem of pileup of impurities such as Si or C at the heterointerface is effectively eliminated and a high quality crystal layer suitable for optical absorption layer is obtained.

A semiconductor photodetection device having therein the photodetection layer of the present invention with a thickness of 1 μm or more shows a sufficient response to the high-speed optical signal transmitted with a rate of 10 Gbit/s at the wavelength of 1620 nm.

FIRST EMBODIMENT

Figure 7:
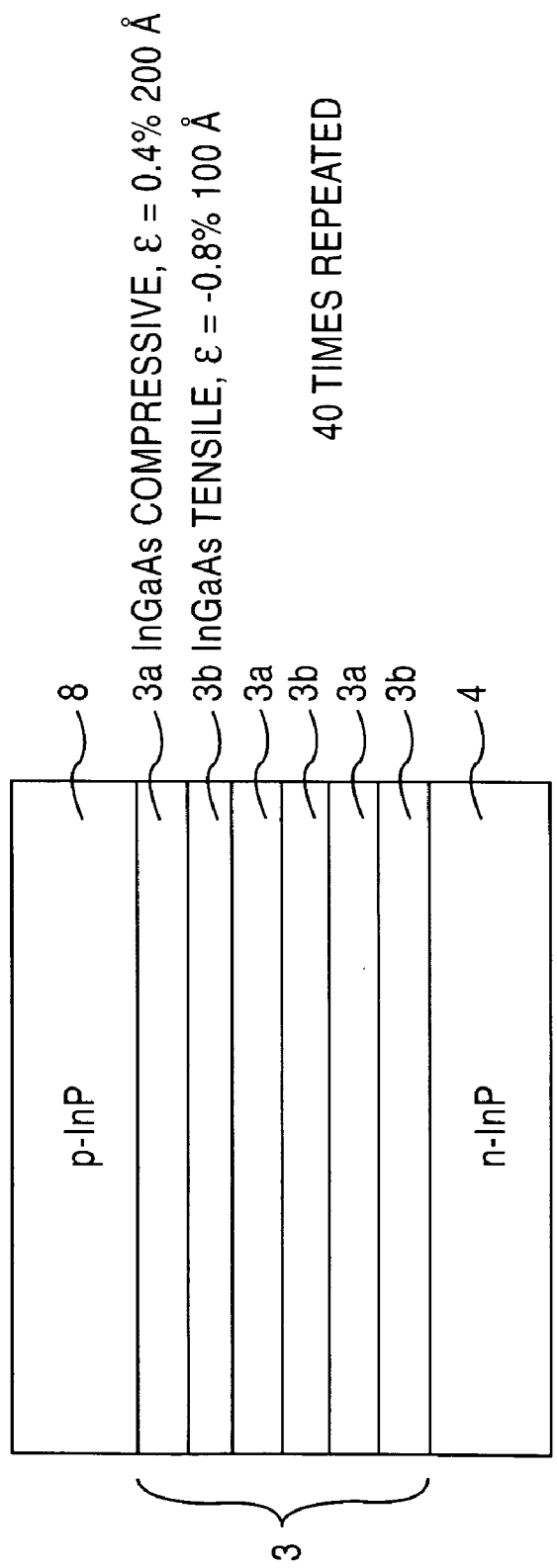
FIG. 7 is a diagram showing a part of a semiconductor photodetection device according to a first embodiment of the present invention.

FIG. 7 shows the construction of a semiconductor photodetection device 30 according to a first embodiment of the present invention, wherein those parts corresponding to the parts described previously are designated by the same reference numerals and the description thereof will be omitted. It should be noted that the construction of FIG. 7 is used in the general structure of the photodetection device represented in FIG. 1.

Referring to FIG.7, the semiconductor photodetection device 30 has a general construction similar to the conventional semiconductor photodetection device 20 explained with reference to FIG. 1 except that the photodetection layer 3 is formed of an alternate repetition of an InGaAs optical absorption layer 3a having a thickness of 20 nm and accumulating a compressive strain of 0.4% and an InGaAs strain-compensating layer 3b having a thickness of 10 1nm and accumulating therein a tensile strain of −0.8%. In the superlattice structure of the photodetection layer 3, the layers 3a and 3b are repeated 40 times.

Figure 1:
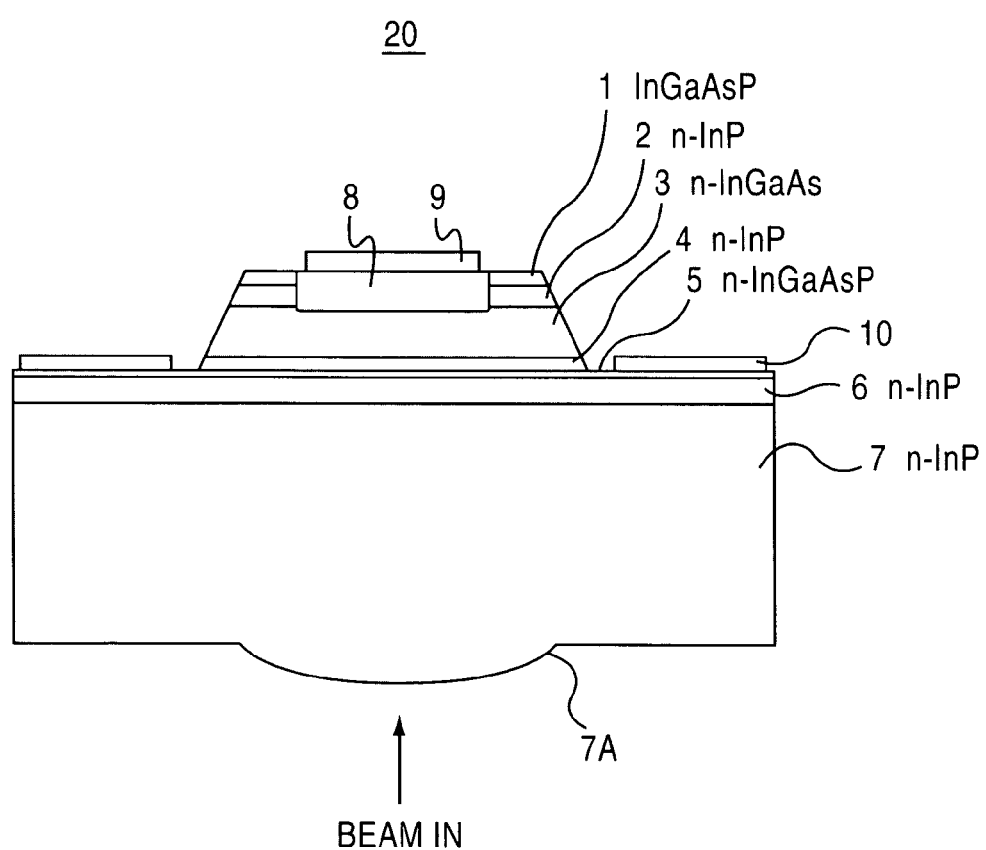
FIG. 1 is a diagram showing the construction of a conventional semiconductor photodetection device.
Figure 2:
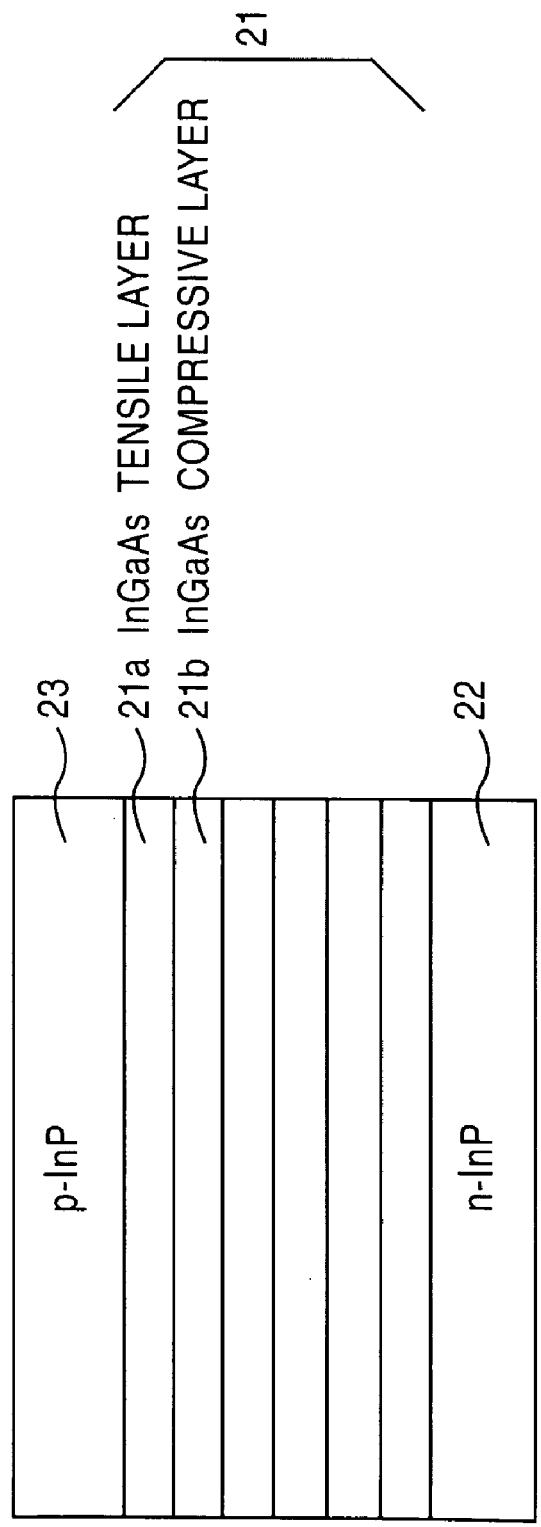
FIG. 2 is a diagram showing a part of another conventional semiconductor photodetection device.

In more detail, the first InP buffer layer 6, the InGaAsP etching stopper layer 5, the second InP buffer layer 4, the InGaAs photodetection layer 3, the InP cladding layer 2 and the InGaAsP contact layer 1 are formed consecutively on the n-type InP substrate 7 in the structure of FIG. 1 by an MOVPE process at the substrate temperature of 600° C. while setting the flow-rate of the group V source material to be larger than the flow-rate of the group III source material by a factor of 200.

In the illustrated example, the first InP buffer layer 6 is formed to have a thickness of about 50 nm and is doped to n-type with Si to a concentration level of $2\times10^{17}\text{cm}^{-3}$. Further, the InGaAsP etching stopper layer 5 is formed to have a thickness of about 10 nm and is doped to n-type with Si to a concentration level of $1\times10^{18}\text{cm}^{-3}$. Further, the InP buffer layer 4 on the etching stopper layer 5 is formed to have a thickness of about 50 nm and is doped to n-type with Si to a concentration level of $2\times10^{17}\text{cm}^{-3}$.

After formation of the InP buffer layer 4, a first semiconductor layer having a composition of $In_{0.59}Ga_{0.41}As$ is formed on the buffer layer by supplying TMIn, TMGa and $AsH_3$ as MOVPE sources of In, Ga and As, together with Si dopant, wherein the first semiconductor layer thus formed is doped with Si to a concentration level of about $1\times10^{15}\text{cm}^{-3}$ and is used for the optical absorption layer 3a. Further, a second semiconductor layer 3b having a composition of $In_{0.44}Ga_{0.56}As$ is formed similarly as the strain-compensating layer 3b, wherein the strain compensating layer 3b is doped also by Si to a concentration level of about $1\times10^{15}\text{cm}^{-3}$. The layers 3a and 3b are stacked repeatedly and alternately 40 times as noted previously to form the photodetection layer 3.

As noted previously, the optical absorption layer 3a thus formed accumulates therein a compressive strain of +0.4%, while the strain-compensating layer 3b accumulates a tensile strain of −0.8%. It should be noted that the product of the strain and thickness is substantially the same in the optical absorption layer 2a and in the strain-compensating layer 3b. Thus, the strain is effectively compensated for in the photodetection layer 3 as a whole.

Further, the photodetection layer 3 thus formed is covered with the InP cladding layer 8 doped to n-type with Si to a concentration level of $5\times10^{15}\text{cm}^{-3}$, wherein the InP cladding layer 8 is formed with a thickness of about 1 μm. Further, the undoped InGaAsP contact layer 1 is formed on the cladding layer 8 with a composition providing a PL wavelength of 1.3 μm.

Further, the p-type diffusion region is formed in the InGaAsP contact layer 1 and further in the InP cladding layer 2 underneath with a disc shape having a diameter of about 20 μm and a thickness of about 1 μm, by conducting a diffusion process of Zn. Further, the semiconductor layers 1–4 are subjected to a mesa etching process while using the InGaAsP layer 5 as an etching stopper and the mesa structure is formed on the InGaAsP layer 5.

Finally, the micro-lens 7A is formed on the bottom surface of the InP substrate 7, and the p-type electrode 9 and the n-type electrode 10 are formed.

In the semiconductor photodetection device 30 thus formed, the optical absorption layer 3a has a reduced bandgap due to the increased In content and efficient optical absorption is achieved at the long optical wavelength of 1620 nm band even when used in a very low temperature environment of −40° C.

In the semiconductor photodetection device 30, it should be noted that the optical absorption layer 3a accumulates therein a compressive strain due to increased In concentration therein, while the strain-compensating layer 3b, adjacent to the optical absorption layer 3a, accumulates a tensile strain due to decreased In concentration therein and compensates for the compressive strain of the optical absorption layer 3a. As the strain in the optical absorption layer 3a is thus compensated for, no substantial defect formation occurs in the optical absorption layer 3a even when the structural unit formed of the optical absorption layer 3a and the strain-compensating layer 3b is repeated 100 times.

In the photodetection device 30, the thickness of the strain-compensating layer 3b is set smaller than the thickness of the optical absorption layer 3a. Further, the strain in the strain-compensating layer 3b is increased such that the product of the tensile strain and the thickness of the strain-compensating layer becomes substantially identical with the product of the compressive strain and the thickness of the optical absorption layer 3a.

According to such a construction, the fraction of the strain-compensating layer 3b in the photodetection layer 3 not contributing to optical absorption is minimized, and hence the total thickness of the photodetection layer 3 is minimized. Thereby, distance of the current path of the optically excited electrons and holes reaching respective electrodes in the form of photocurrent is minimized. Thus, the semiconductor photodetection device of the present invention shows excellent high-speed response sufficient for detecting high-speed optical transmission of 10 Gbit/s used in the optical fiber telecommunication network of future.

In the process of forming the photodetection layer 3, it is desirable to supply the In source material such as TMIn, Ga source material such as TMGa, and As source material such as $AsH_3$ continuously while changing the ratio of TMIn and TMGa when forming the optical absorption layer 3a and when forming the strain-compensating layer 3b. By doing so, the crystal growth for forming the photodetection layer 3 is not interrupted at the interface between the layer 3a and the layer 3b and the problem of pileup of impurities such as C or Si atoms at the hetero interface of the layers 3a and 3b is avoided. The photodetection layer 30 thus obtained shows excellent crystal quality.

SECOND EMBODIMENT

Figure 8:
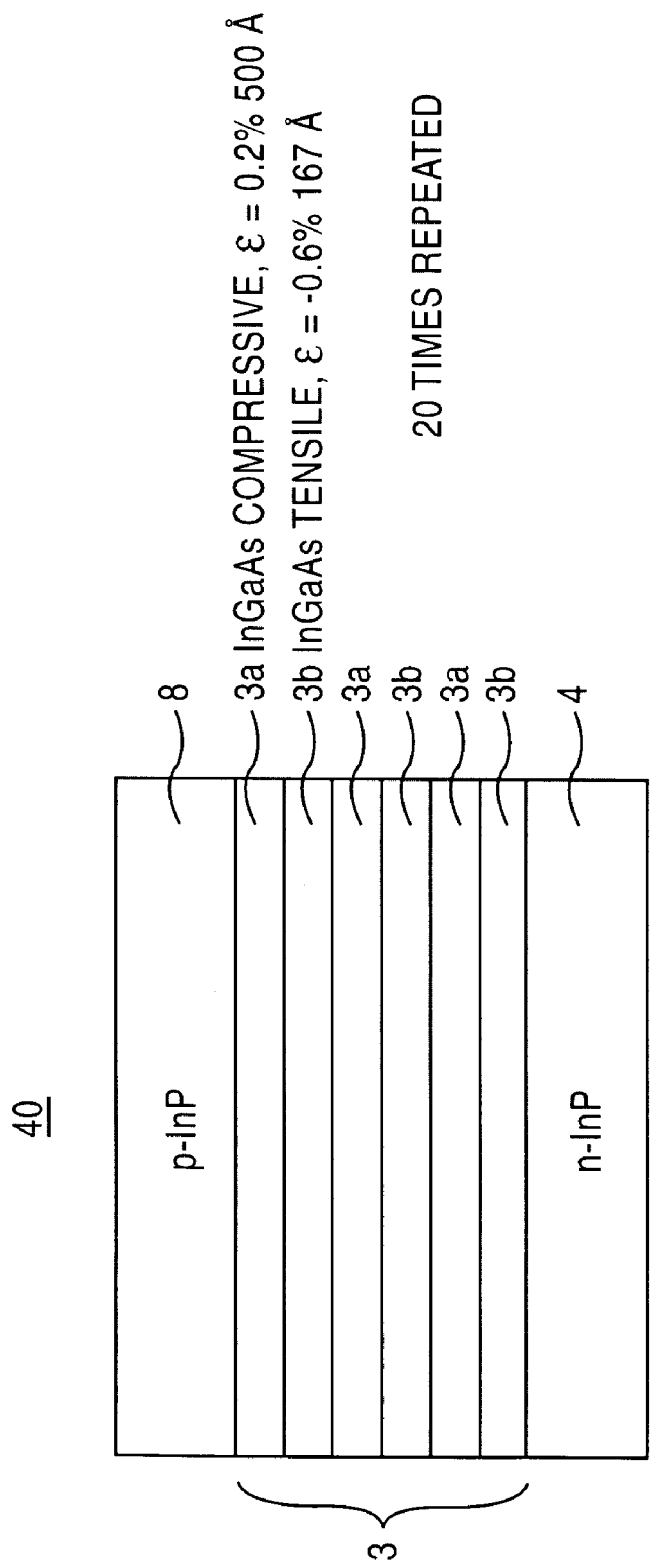
FIG. 8 is a diagram showing a part of a semiconductor photodetection device according to a second embodiment of the present invention.

FIG. 8 shows the construction of a semiconductor photodetection device 40 according to a second embodiment of the present invention, wherein those parts corresponding to the parts described previously are designated by the same reference numerals and the description thereof will be omitted.

Referring to FIG. 8, the optical absorption layer 3a is formed to have a thickness of 50 nm, and associated with this, the strain-compensating layer 3b is formed to have a thickness of 16.7 nm or more. Further, the optical absorption layer 3a accumulates a compressive strain of +0.2% and the strain-compensating layer 3b accumulates a tensile strain of −0.6%. Thereby, the condition that the product of the strain and thickness in the optical absorption layer 3a should be equal to the product of the strain and thickness in the strain-compensating layer is satisfied, similarly to the previous embodiment. Because of the increased thickness of the optical absorption layer 3a, the number of repetition of the layers 3a and 3b is reduced in the semiconductor photodetection device 40 to about 20.

In the construction of FIG. 8, there is a possibility that a quantum well may be formed in the optical absorption layer 3a due to the extremely small thickness of the layer 3a of about 10 nm. In the case of the present embodiment in which the optical absorption layer 3a has a thickness of 50 nm, there is no possibility of quantum well formation in the optical absorption layer 3a. Because the possibility of quantum well formation is thus positively excluded, no quantum levels are formed in the optical absorption layer 3a and the problem of the absorption wavelength of the layer 3a causing a shift in the short wavelength direction as a result of such quantum level formation is successfully and positively avoided.

THIRD EMBODIMENT

Figure 9:
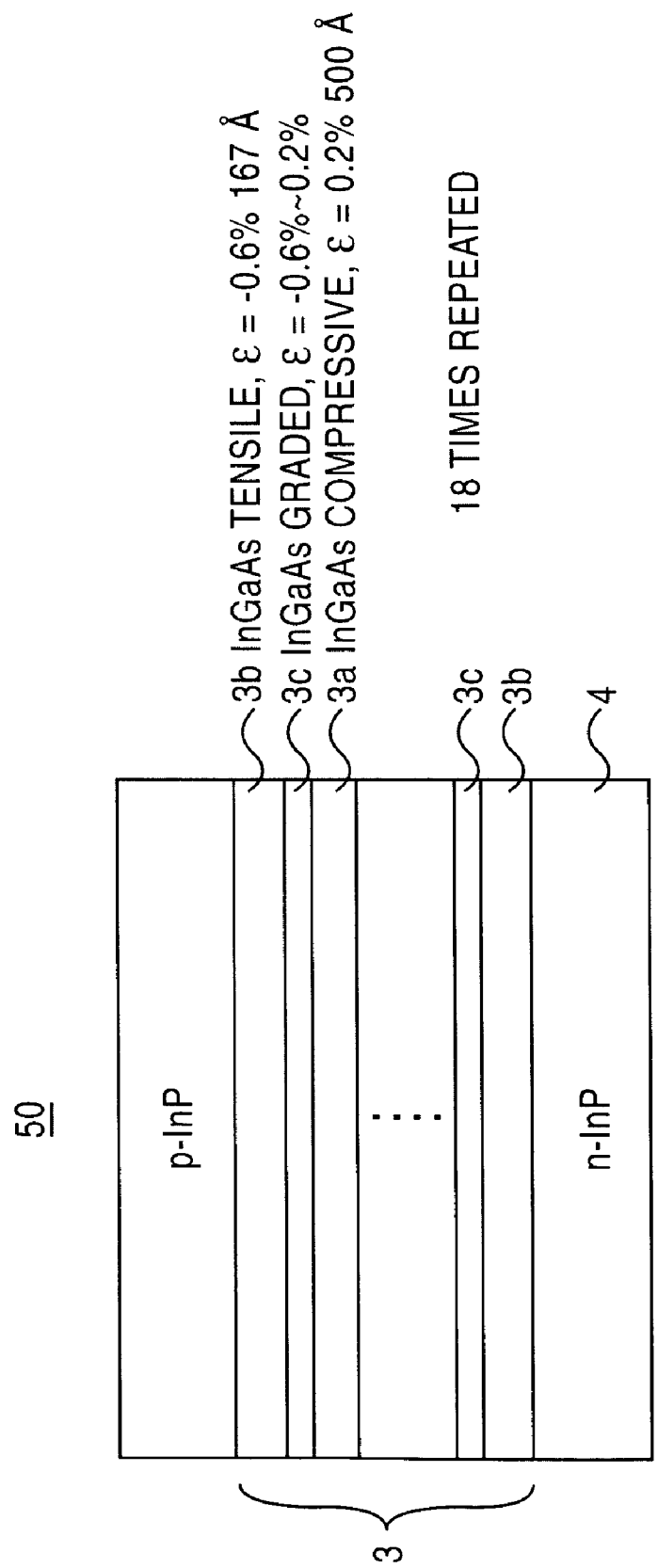
FIG. 9 is a diagram showing a part of a semiconductor photodetection device according to a third embodiment of the present invention.

FIG. 9 shows the construction of a semiconductor photodetection device 50 according to a third embodiment of the present invention, wherein those parts corresponding to the parts described previously are designated by the same reference numerals.

Referring to FIG. 9, the semiconductor device 50 has a construction similar to that of semiconductor photodetection device 40 of the previous embodiment, except that there is formed an intermediate layer 3c of n-type InGaAs having an intermediate bandgap to the optical absorption layer 3a and the strain-compensating layer 3b at the interface of the optical absorption layer 3a facing the stress-compensating layer 3b at the near side of the p-type region 8 (the interface of the layer 3a locating at the far side from the substrate 7). The intermediate layer 3c may be an InGaAs layer having a strain-free composition.

In the previous embodiment, there still remains a bandgap difference at the interface between the optical absorption layer 3a and the strain-compensating layer 3b in spite of the fact that the photodetection layer 3 as a whole is compensated with the strain, wherein the bandgap difference functions as a potential barrier blocking the flow of carriers moving across the interface between the layers 3a and 3b. As a result of the blocking of carrier flow by the potential barrier, there can be a case in which the carries may cause accumulation at such an interface. This problem of carrier blockade appears particularly serious in holes having a smaller mobility. When this problem occurs, the operational speed of the semiconductor photodetection device may be deteriorated.

The intermediate layer 3c interposed between the top surface of the optical absorption layer 3a and the bottom surface of the strain-compensating layer 3b relaxes the bandgap difference between the layers 3a and 3b. Further, the intermediate layer 3c may be formed to have a graded compositional profile in the thickness direction or multilayer structure for In and Ga such that the layer 3c accumulates a compressive strain at the side contacting the optical absorption layer 3a and a tensile strain at the side contacting the strain-compensating layer 3b.

While not illustrated, the intermediate layer 3c may be interposed into the interface formed between the top surface of the strain-compensating layer 3b and the bottom surface of the optical absorption layer 3a. According to such a construction, the problem of the optically excited electrons being blocked at such an interface is resolved. In this case, the intermediate layer 3c may be provided with a graded compositional profile for In and Ga in the thickness direction such that the intermediate layer 3c accumulates a compressive strain at the side facing the optical absorption layer 3a located above and such that the intermediate layer 3c accumulates a tensile strain at the side facing the strain-compensating layer 3b located below.

It should be noted that the photodetection layer formed of the strained superlattice structure explained heretofore can also be used in avalanche photodiode (APD) in addition to the PIN photodiode.

Further, the present invention is not limited to the embodiments described heretofore but various variations and modifications may be made without departing from the scope of the invention.

What is claimed is:

1. A semiconductor photodetection detector, comprising:
a semiconductor substrate of a first conductivity type;
a photodetection layer formed on said semiconductor substrate;
a region of a second conductivity type opposite to said first conductivity type being formed in a part of said photodetection layer; and
an electrode applying an electric field to said photodetection layer via said region of said second conductivity type such that said electric field acts in a thickness direction of said photodetection layer,
said photodetection layer comprising: a first semiconductor layer having a first thickness and accumulating therein a compressive strain and absorbing an optical radiation; and a second semiconductor layer having a second thickness smaller than said first thickness and accumulating therein a tensile strain, said first semiconductor layer and said second semiconductor layer being stacked alternately and repeatedly in said photodetection layer,
wherein a total of said first thicknesses is smaller than a thickness value Lw below which a flat surface appears at a top surface of said photodetection layer and above which an irregular surface appears at said top surface of said photodetection layer, said thickness value Lw being represented by a relationship $Lw = A \times \epsilon W + L$, where A takes the value of $-1$ μm/%, $\epsilon W$ represents said compressive strain, and L represents a constant,
and wherein the total thickness of said first and second semiconductor layers is 1.3 μm.

2. A semiconductor photodetection device as claimed in claim 1, wherein said first semiconductor layer accumulates therein a strain of 0.2% or more but not exceeding 0.6%.

3. A semiconductor photodetection device as claimed in claim 1, wherein said first semiconductor layer has a thickness of 50 nm or more.

4. A semiconductor device as claimed in claim 1, wherein the second thickness of said second semiconductor layer is smaller than a sum of the first and second thicknesses by a factor of $(0.9 \times L^{1/4} \times \epsilon)$ in terms of microns, wherein $\epsilon$ represents that strain accumulated in said first semiconductor layer and L represents a sum of a total thickness of said first semiconductor layers in said photodetection layer and a total thickness of said second semiconductor layers in said photodetection layer.

5. A semiconductor photodetection device as claimed in claim 3, wherein the second thickness of the second semiconductor layer is smaller than one-half the first thickness of the first semiconductor.

6. A semiconductor device as claimed in claim 5, wherein the second thickness of said second semiconductor layer is smaller than a sum of the first and second thicknesses by a factor of $(0.9 \times L^{1/4} \times \epsilon)$ in terms of microns, wherein $\epsilon$ represents the strain accumulated in said first semiconductor layer and L represents a sum of a total thickness of said first semiconductor layers in said photodetection layer and a total thickness of said second semiconductor layers in said photodetection layer.

7. A semiconductor photodetection device as claimed in claim 1, wherein each of said first and second semiconductor layers comprises a ternary compound semiconductor material.

8. A semiconductor device as claimed in claim 7, wherein the second thickness of said second semiconductor layer is smaller than a sum of the first and second thicknesses by a factor of $(0.9 \times L^{1/4} \times \epsilon)$ in terms of microns, wherein $\epsilon$ represents the strain accumulated in said first semiconductor layer and L represents a sum of a total thickness of said first semiconductor layers in said photodetection layer and a total thickness of said second semiconductor layers in said photodetection layer.

9. A semiconductor photodetection device as claimed in claim 1, wherein said substrate comprises n-type InP and said first and second semiconductor layers comprise n-type InGaAs.

10. A semiconductor device as claimed in claim 9, wherein the second thickness of said second semiconductor layer is smaller than a sum of the first and second thicknesses by a factor of $(0.9 \times L^{1/4} \times \epsilon)$ in terms of microns, wherein $\epsilon$ represents the strain accumulated in said first semiconductor layer and L represents a sum of a total thickness of said first semiconductor layers in said photodetection layer and a total thickness of said second semiconductor layers in said photodetection layer.

11. A semiconductor photodetection device as claimed in claim 1, further comprising an intermediate layer between said first and second semiconductor layers, said intermediate layer having an intermediate bandgap between a bandgap of said first semiconductor layer and a bandgap of said second semiconductor layer.

12. A semiconductor device as claimed in claim 11, wherein the second thickness of said second semiconductor layer is smaller than a sum of the first and second thicknesses by a factor of $(0.9 \times L^{1/4} \times \epsilon)$ in terms of microns, wherein $\epsilon$ represents the strain accumulated in said first semiconductor layer and L represents a sum of a total thickness of said first semiconductor layers in said photodetection layer and a total thickness of said second semiconductor layers in said photodetection layer.

13. A semiconductor photodetection device as claimed in claim 11, wherein said intermediate layer is provided at a side of said first semiconductor layer closer to said region of said second conductivity type.

14. A semiconductor photodetection device as claimed in claim 11, wherein said intermediate layer has a composition profile that changes gradually in a thickness direction thereof.

15. A semiconductor photodetection device as claimed in claim 14, wherein said intermediate layer accumulates a tensile strain at a side thereof contacting said second semiconductor layer and a compressive strain at a side thereof contacting said first semiconductor layer.

* * * * *